United States Patent [19]

Atkinson et al.

[11] Patent Number: 4,947,456
[45] Date of Patent: Aug. 7, 1990

[54] SCANNING RADIO RECEIVER

[75] Inventors: Noel D. Atkinson; William B. Ahlemeyer, both of Indianapolis; Ben F. McCormick, Noblesville, all of Ind.

[73] Assignee: Uniden America Corporation, Ft. Worth, Tex.

[21] Appl. No.: 366,199

[22] Filed: Jun. 9, 1989

Related U.S. Application Data

[63] Continuation of Ser. No. 245,835, Sep. 16, 1988, abandoned, which is a continuation of Ser. No. 21,008, Mar. 2, 1987, abandoned, which is a continuation-in-part of Ser. No. 884,278, Jul. 10, 1986, abandoned.

[51] Int. Cl.$^5$ .............................................. H04B 1/16
[52] U.S. Cl. .................................... 455/165; 455/183; 455/218
[58] Field of Search ............... 455/183, 185, 186, 218, 455/220, 222, 223, 174, 166, 165, 161, 221

[56] References Cited

U.S. PATENT DOCUMENTS

| | | | |
|---|---|---|---|
| 3,934,206 | 1/1976 | Holecek | 455/220 |
| 4,245,348 | 1/1981 | Imazeki | 455/222 X |
| 4,344,175 | 8/1982 | Leslie | 455/218 X |
| 4,461,036 | 7/1984 | Williamson et al. | 455/166 X |
| 4,521,915 | 6/1985 | Baker et al. | 455/166 X |
| 4,525,867 | 6/1985 | Shiratani | 455/166 X |
| 4,547,902 | 10/1985 | Kasperkovitz | 455/218 X |
| 4,561,112 | 12/1985 | Ridder | 455/166 |

FOREIGN PATENT DOCUMENTS 3126116  1/1983  Fed. Rep. of Germany ...... 455/174

Primary Examiner—Benedict V. Safourek
Assistant Examiner—Ralph Smith
Attorney, Agent, or Firm—Woodard, Emhardt, Naughton, Moriarty & McNett

[57] ABSTRACT

A high-speed, multi-band scanning radio receiver. A frequency synthesizer loaded with a digital code read from memory performs band switching and supplies tracking signals and a local oscillator signal to multi-band RF amplifier and mixer circuitry. An output of an FM detector in the receiver is connected to a squelch circuit which includes a high-pass filter network and a diode detector, with the diode detector output being connected to an internal A/D converter of a microprocessor which converts multiple samples of the incoming signal to digital values and generates a mute signal when the average value of the converted samples is below a predetermined squelch level. An output line from the FM detector to audio output circuitry in the receiver is grounded in response to the mute signal. The microprocessor is also programmed to control receiver tuning during SEARCH mode such that searching continues until the demodulator output signal for an active channel is substantially in the center of the demodulator S curve, as detected by a window detector.

12 Claims, 10 Drawing Sheets

SCAN MODE

SEARCH MODE 4,947,456

SCANNING RADIO RECEIVER

CROSS REFERENCE TO RELATED APPLICATION

This application is a continuation of Ser. No. 245,835, filed Sept. 16, 1988, now abandoned, which is a continuation of Ser. No. 021,068 filed Mar. 2, 1987, now abandoned, which is a continuation in part of application Ser. No. 884,278, filed July 10, 1986 now abandoned.

BACKGROUND OF THE INVENTION

This invention relates to scanning radio receivers, and more particularly to scanning radio receivers with frequency synthesizers.

Early scanning receivers used crystals for tuning, and the number of channels available for reception was limited by the number of crystals in a given receiver. A receiver typically contained either eight or sixteen crystals, and different crystals had to be installed to enable reception of different frequencies, including the frequencies of other desired transmissions within range of the receiver as well as, in the case or relocation or portable operation, the assigned frequencies in a different geographical region.

Modern scanning receivers generate local oscillator frequencies with a frequency synthesizer controlled by frequency codes stored in memory. Typically, the memory still contains a small number of frequency codes, but it can be reprogrammed for operation or different frequencies. The channel capacity of scanning receivers has heretofore been limited not only because of the size, cost and complexity of memory circuitry and associated addressing circuitry, but also because of technical limitations on scanning speed. A finite amount of time is required to lock on to each frequency in the active scanning sequence, and then to detect activity on the current channel in order to determine whether or not to continue scanning.

Another limitation of conventional scanning radio receivers involves SEARCH mode operation, in which tuning is performed sequentially in fixed frequency steps. Since the frequency spacings between allocated channels vary from band to band, the least common denominator is commonly used as the frequency step. For example, 5 KHz is a typical frequency step in the aircraft, low VHF and high VHF bands, where channel spacings are 25, 20 and 15 KHz, respectively. A frequency step smaller than conventional channel-to-channel spacing is also provided in some scanners to allow for reception of transmissions on channels between allocated channels. As a result of such scanning techniques, it is common for the frequency step to be less than the receiver bandwidth, whereby scanning can stop, prematurely, on a frequency one or more frequency steps away from the frequency of an active channel. This occurs when the signal on the active channel passes through the IF filters of the receivers with sufficient amplitude to trigger the squelch circuit. Such inaccurate tuning does not occur in SCAN mode, during which the receiver tunes sequentially to user-selected channels, because in SCAN mode the frequency synthesizer is only loaded with frequency codes precisely corresponding to allocated frequencies. However, the small frequency increments encountered in SEARCH mode often leave a conventional scanning receiver susceptible to mistuning and, consequently, poor reception.

SUMMARY OF THE INVENTION

The present invention provides a high-speed scanning radio receiver in which the demodulated signal produced by a superheterodyne receiver is processed by a squelch circuit having an input filter network, a noise detector connected to the input filter network, an A/D converter for converting samples of the noise detector output signal of digital values, and means for generating a mute signal when the average value of the converted samples is below a predetermined level.

It is a general object of the present invention to provide an improved scanning radio receiver.

Another object of the invention is to provide a high-speed scanning receiver.

An object of another aspect of the invention is to provide a versatile scanning receiver capable of accurately tuning to active channels during search mode.

These and other objects and advantages of the present invention will become more apparent upon reading the following detailed description of the preferred embodiment in conjunction with the accompanying drawings.

DESCRIPTION OF THE PREFERRED EMBODIMENT

Figure 1:
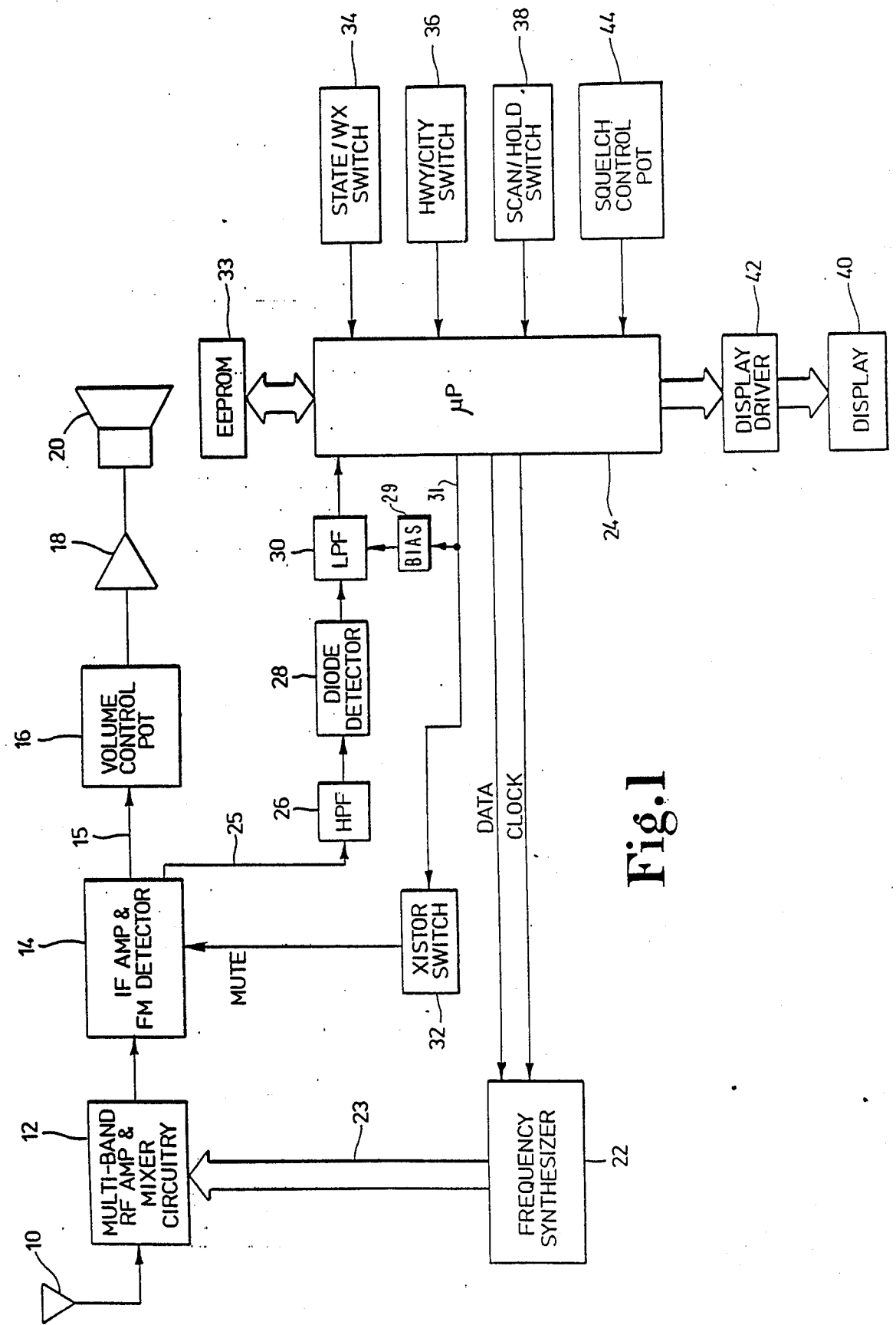
FIG. 1 is a block diagram of one embodiment of the scanning radio receiver according to the present invention.

For the purposes of promoting an understanding of the principles of the invention, reference will now be made to the embodiment illustrated in the drawings and specific language will be used to describe the same. It will nevertheless be understood that no limitation of the scope of the invention is thereby intended, such alterations and further modifications in the illustrated device, and such further applications of the principles of the invention as illustrated therein being contemplated as would normally occur to one skilled in the art to which the invention relates.

With reference to FIG. 1, the preferred embodiment of a scanning radio receiver according to the present invention includes an antenna 10 coupled to a conventional superheterodyne FM receiver which includes RF amplifier and mixer circuitry 12, an IF amplifier and FM detector 14, a volume control potentiometer (pot) 16, an audio amplifier 18 and a speaker 20. The RF amplifier and mixer circuitry 12 includes individual RF amplifiers and mixers for the low and high VHF bands as well as the UHF band, as well as appropriate tracking circuits. The local oscillator signal for the receiver is generated by frequency synthesizer 22, which also supplies tracking signals to the three RF amplifiers and performs band switching as required. Multi-band RF amplifier and mixer circuitry such as that just described is well known in the art and does not require detailed description.

Frequency synthesizer 22 generates local oscillator frequencies with a conventional phase-locked loop (PLL) in which the output of a voltage-controlled oscillator (VCO) is prescaled by a dual modulus prescaler, divided in frequency by a programmable divider, and then compared in frequency and phase with the output of a reference signal, the comparator output signal being filtered and supplied to the VCO as an error signal. The PLL in this embodiment employs a single VCO having a primary tuning coil and a second coil which is switched into a parallel connection with the primary coil for operation in the high VHF or UHF bands, with the VCO output connected to the low VHF band mixer as well as to a frequency doubler connected in cascade to a frequency tripler. The output of the frequency doubler is connected to the high VHF band mixer input, and the output of the frequency tripler is connected to the UHF band mixer input. Frequency synthesizer 22 also includes internal registers into which data is loaded from microprocessor 24 for the purpose of programming the synthesizer's programmable divider. Microprocessor 24, preferably a Motorola MC68705R3 microprocessor, supplies data serially to synthesizer 22 via the DATA line along with a clock signal on the CLOCK line. The local oscillator and control signals from frequency synthesizer 22 are supplied on lines 23 to RF amplifier and circuitry 12. Frequency synthesizer 22 preferably includes an integrated-circuit (IC) synthesizer such as the Motorola MC145156 modified to include one additional band switch output, or equivalent, and an IC prescaler such as the Motorola MC12015 dual modulus prescaler. Alternatively, the available two band switch outputs of the MC145156 may, by decoding, be used to switch up to four bands. The use of a latched synthesizer such as the MC145156 enables faster scanning through closely spaced frequencies because, in such situations, a minimal number of bits is changed for each new channel whereby PLL settling time is reduced.

IF amplifier-detector 14 includes as a primary circuit element a Motorola MC3359 integrated FM IF amplifier and detector. The output of the FM detector is continually supplied on output line 25 to high-pass filter (HPF) 26, and is selectively supplied to output line 15 under control of the signal on the MUTE input line, which is connected to internal audio mute control circuitry in IF amplifier detector 14. The mute control circuitry grounds line 15 to disable the receiver audio output circuit. The audio output circuit may of course be disabled in other ways, such as by switching the power off to audio amplifier 18.

High-pass filter 26 is the first stage of a squelch circuit which, in the embodiment of FIG. 1, additionally includes a diode detector 28 connected to a low-pass filter (LPF) 30 which in turn is connected to the input of an internal A/D converter in microprocessor 24. As will be described later in greater detail, microprocessor 24 analyzes the incoming signal from low pass filter 30 and, when it is determined that no signal is present on the frequency to which the receiver is currently tuned, outputs a squelch signal on line 31 to transistor switch 32 which activates the internal audio mute control circuitry in IF amplifier-detector 14 for muting the audio.

Figure 2:
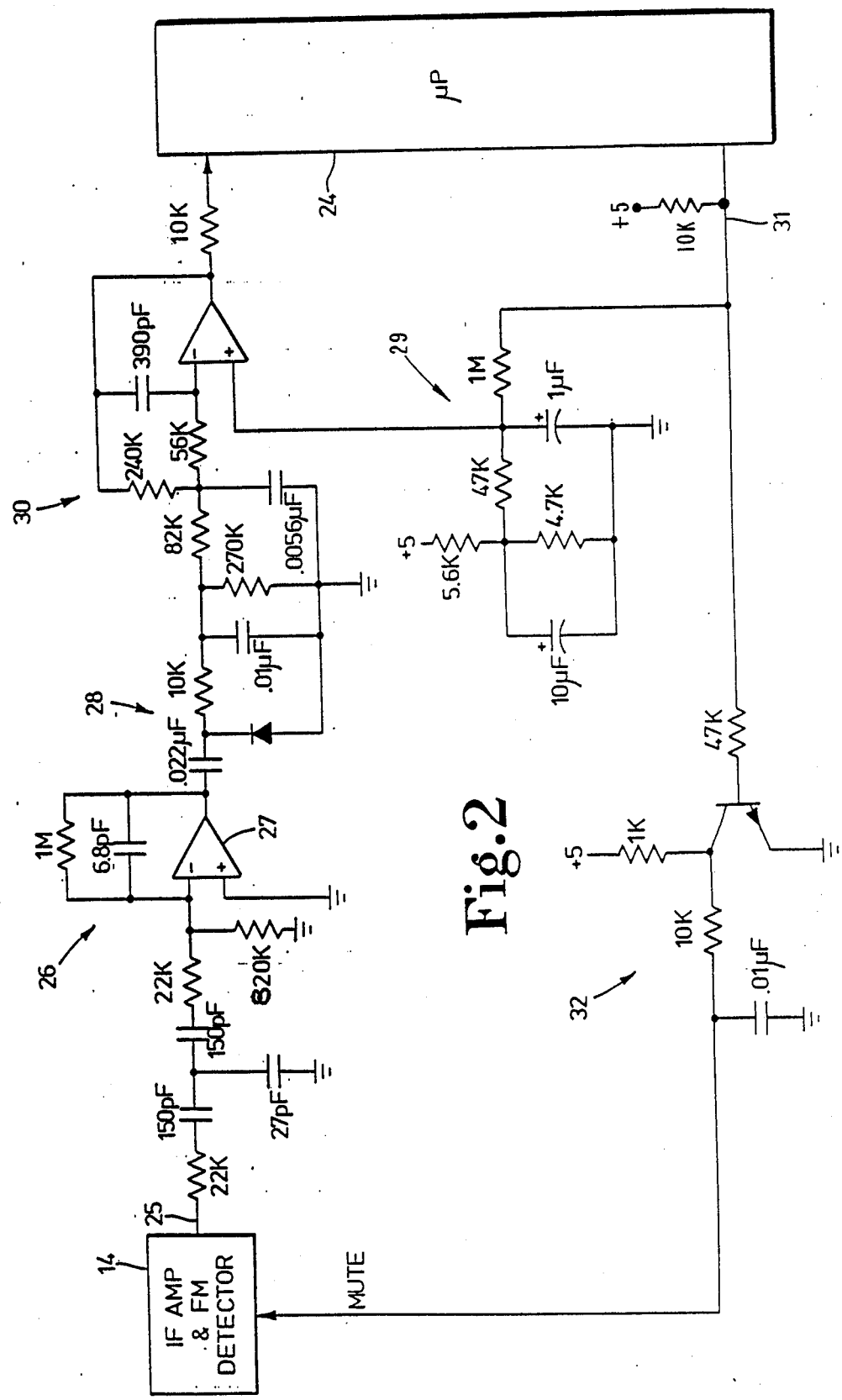
FIG. 2 is a detailed electrical schematic of a portion of the scanning radio receiver shown in FIG. 1.

FIG. 2 shows the detailed construction of filters 26 and 30 and detector 28. High-pass filter 26 is provided to attenuate voice-frequency signals relative to noise signals and thereby reduce the incidence of voice activation of the squelch which would cause premature resumption of scanning. Filtering of voice frequencies is intended to mean filtering of signals in the frequency range of approximately 1-3 Khz. In the preferred embodiment, filter 26 additionally filters out tone signals. A unity-gain, first-order Chebyshev high-pass filter with a corner frequency of 11 KHz has been found suitable for this purpose, and is constructed using an operational amplifier (op amp) 27 is internal to the MC3359 IC. Diode detector 28 includes a simple RC output filter with a very small time constant, preferably 0.1 milliseconds, for greater speed in the squelch circuit and, cosequently, greater scanning speed. Filter 30 is provided to attenuate higher voice and tone frequencies, and distortion due to overdeviation in the received signal, and thereby further reduce the incidence of false squelch triggering. A suitable filter for this purpose is a second-order Chebyshev low-pass filter with gain of 9.5 db and a corner frequency of 1290 Hz, as shown in FIG. 2. Hysteresis is provided in software for the squelch circuit, as will be described, and additional hysteresis is provided by bias adjusting circuit 29 connected to the noninverting input of the op amp of filter 30, as shown in FIG. 2. This additional hysteresis helps prevent squelch chatter in response to low signal levels near threshold.

Figure 3:
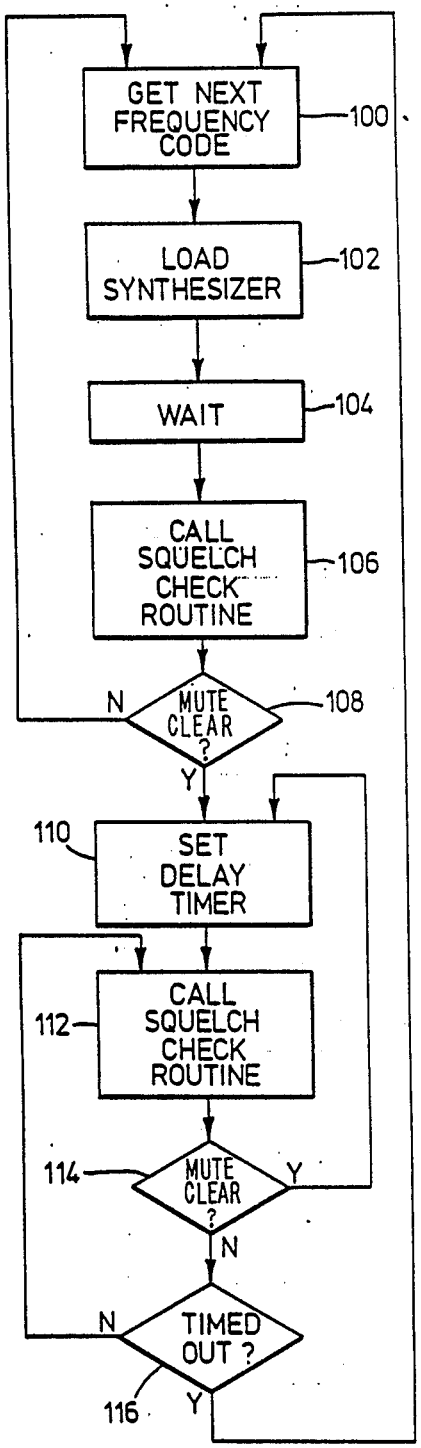
FIG. 3 is a flowchart of the scanning program executed by the microprocessor of FIG. 1.
Figure 4:
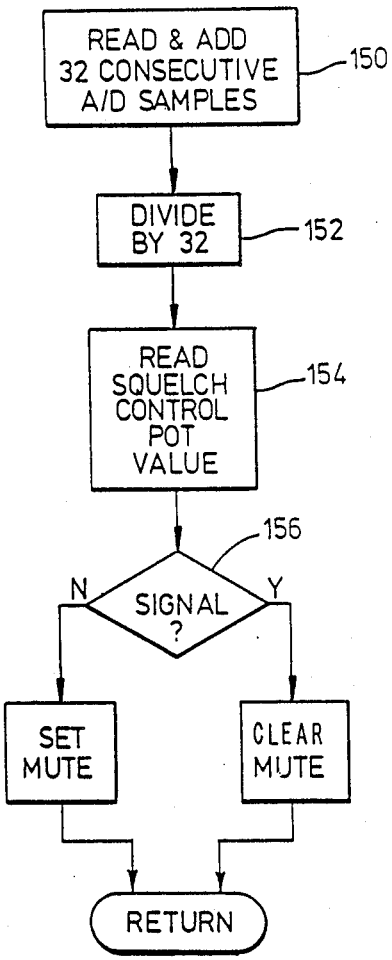
FIG. 4 is a flowchart of the squelch check routine identified in the flowchart of FIG. 3.

Microprocessor 24 controls frequency scanning according to the program shown in the flowcharts of FIGS. 3 and 4, which program is stored in internal read-only memory (ROM) in the microprocessor. Microprocessor 24 is connected to an electrically erasable, programmable read-only memory (EEPROM) 33, preferably a National Semiconductor NMC9306, which is used for storing the current state identification code. The internal ROM in the microprocessor contains a frequency matrix including the public-service-band frequency allocations for each state in the United States, with the frequencies grouped according to (1) frequencies used by state police and highway patrols (HWY frequencies), and (2) frequencies used by local police such as city police and county sheriffs (CITY frequencies). For economy of memory usage, each state to which a particular frequency is allocated is indicated by the status of an individual bit assigned in a memory location associated with the particular frequency. The internal ROM also contains frequency codes for the weather (WX) channels allocated by the FCC. STATE/WX switch 34 is provided for selecting a particular state or for selecting weather channel scanning, HWY/CITY switch 36 enables selection between state police and local police for a selected state, and SCAN/HOLD switch 38 initiates and terminates scanning operation. Switch 34 is preferably a three-position switch with one end position for weather-band selection, a second, momentary, end position in which the microprocessor scans through internally stored state identification data, and a middle position in which, during SCAN mode, the receiver scans the frequencies for the currently selected state. Microprocessor 24 displays the currently selected state on a display 40 driven by a display driver 42. One suitable display consists of two 16-segment alphanumeric displays commercially available from Lite-On Corporation, 4951 Airport Parkway Drive, Dallas, Tex., as type LTP587, and a suitable corresponding display driver is the National Semiconductor MM5484. A number of other suitable alphanumeric displays are available, in light-emitting diode (LED), liquid-crystal display (LCD) and vacuum fluorescent (VF) form. The receiver additionally includes a squelch control pot 44 which is used to establish a predetermined squelch level for the receiver.

The squelch circuit will now be described in greater detail with combined reference to FIGS. 1, 3 and 4. In conjunction with the program to be described, microprocessor 24 executes certain housekeeping routines on timer interrupts. Specifically, at predetermined intervals the microprocessor checks the status of switches 34, 36 and 38 and multiplexes the display. Frequency scanning begins when SCAN mode is selected through SCAN/HOLD switch 38. In step 100, the microprocessor accesses its internal ROM to get a new frequency code for the frequency synthesizer. Codes are read from memory as a function of the position of STATE/WX switch 34 and, when switch 34 is in its middle position, the position of HWY/CITY switch 36. That is, with STATE scanning selected, when switch 36 is set for HWY scanning, all frequencies in the HWY frequency group for the currently selected state are selected for scanning, and, when switch 36 is set for CITY scanning, all frequencies in the CITY frequency group for the currently selected state are selected. When switch 34 is in the WX position, weather channels are scanned without regard to the position of switch 36.

After reading the code from memory, microprocessor 24 loads the synthesizer, in step 102, with an 18-bit serial data word and then waits approximately 23 milliseconds (step 104) before calling the squelch check routine (step 106). In the preferred embodiment the receiver operates with a scan rate of approximately 40 channels per second, which corresponds to a scan time per channel of 25 milliseconds. Approximately 2 milliseconds is required for obtaining the next frequency code for a selected state and frequency group, loading the synthesizer and running the squelch check routine, and during the remaining 23 milliseconds of the scan time per channel the microprocessor executes a wait loop during which system transients die down.

In the squelch check routine shown in the flowchart of FIG. 4, microprocessor 24 takes 32 consecutive samples from its internal A/D converter. The internal A/D converter has a conversion time of 30 microseconds, thus samples are taken over an interval of 0.96 milliseconds. The 32 samples are added together, and then, in step 152, the accumulated total is divided by 32 by shifting the digital value to the right by 5 bits. The value of the squelch control pot 44 is sampled in step 154 and compared, in step 156, with the value determined in step 152. The presence or absence of a signal is determined according to a hysteresis curve having upper and lower set points equal to the value of the sample from the squelch control pot ±15. With A/D resolution of 8 bits and an A/D reference voltage of 5 volts, this level of hysteresis corresponds to approximately ±130 millivolts. If a signal is determined to be present, the microprocessor resets the MUTE line, and conversely, if no signal is present, the microprocessor sets the MUTE line. In either event, program control returns to the main program. The MUTE line is used as a point of reference in the description of the program although, as will be appreciated by those skilled in the art, the microprocessor sets and clears the MUTE line indirectly, through switch 32, which inverts the corresponding microprocessor output, on line 31, and introduces a delay. Thus, as used herein in the context of microprocessor operations, MUTE line state will be understood to mean the commanded state, as opposed to the actual state of the MUTE line.

The state of the MUTE line is also used by the main program to determine whether or not a signal is present. The microprocessor branches from step 108 back to step 100 if a signal is not present on the currently received channel, and otherwise proceeds to step 110. As indicated earlier, the receiver audio is muted if no signal is present, whereas the audio output circuit is enabled to audibly reproduce an audio signal if one is found on the current channel.

If the squelch is released, a 50-millisecond delay timer is set in step 110 before the squelch is checked again, which occurs in step 112. This time, if there is a signal on the current channel, the microprocessor branches from step 114 back to step 110 to reset the delay timer for another 50 milliseconds. If no signal is currently detected, program control proceeds to decision step 116 wherein the delay timer is checked to see if it has timed out. If the timer has timed out, program control returns to step 100 for resumption of frequency scanning. If not, the squelch check routine is again executed in step 112 to recheck for a signal on the current channel. The delay routine just described allows for momentary lapses in transmissions which occur during normal channel usage.

Figure 5:
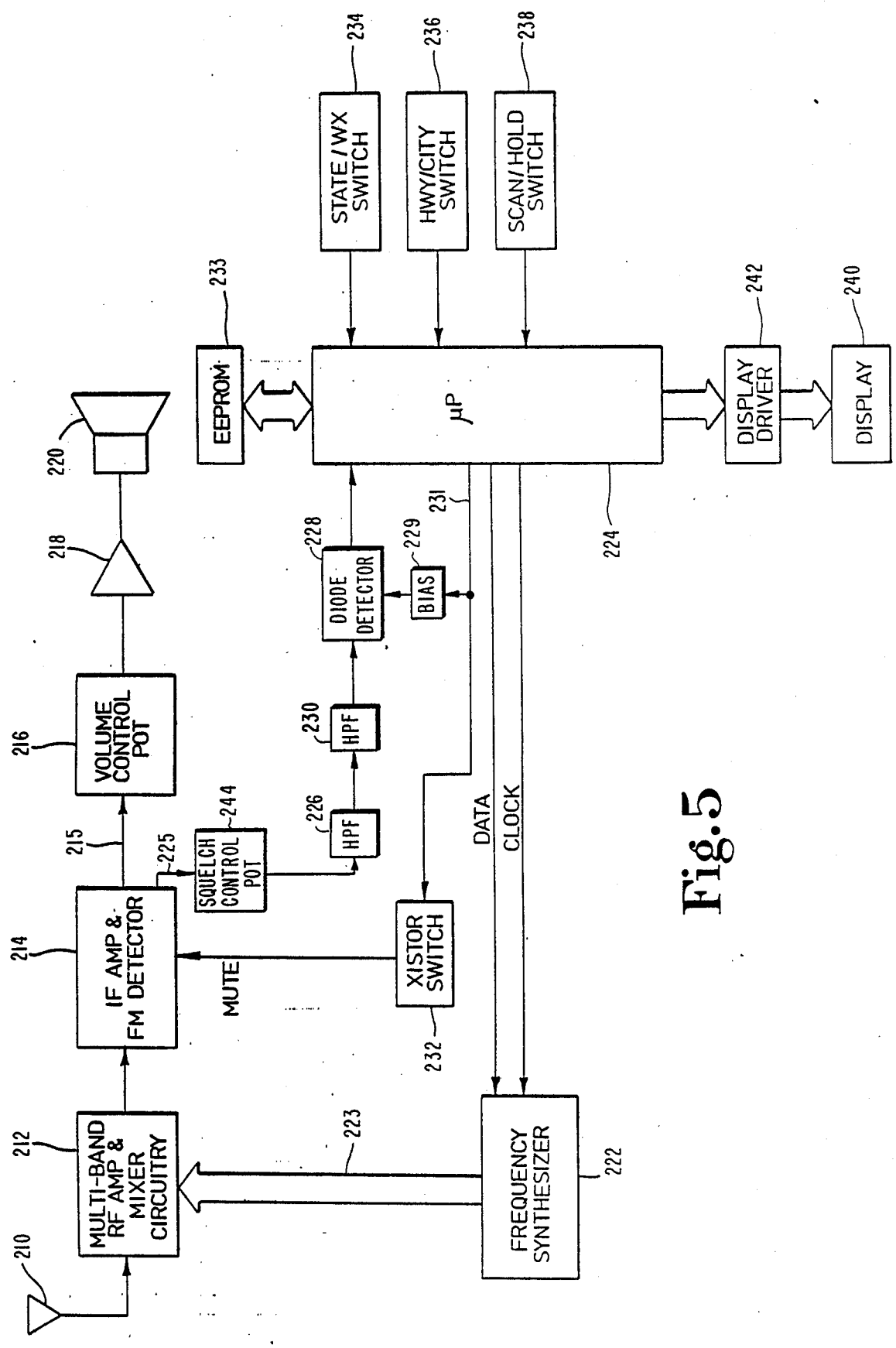
FIG. 5 is a block diagram of an alternative embodiment of the scanning radio receiver according to the present invention.

FIG. 5 illustrates an alternative embodiment of a scanning radio receiver which, like the scanning receiver of FIG. 1, includes conventional superheterodyne FM receiver circuitry in addition to novel circuitry which will be described. An antenna 210 is coupled to RF amplifier and mixer circuitry 212 which in turn is coupled to an IF amplifier and FM detector 214, a volume control potentiometer (pot) 216, an audio amplifier 218 and a speaker 220. RF amplifier and mixer circuitry 212 includes individual RF amplifiers and mixers for the low and high VHF bands as well as the UHF band, as well as appropriate tracking circuits. The local oscillator signal for the receiver is generated by frequency synthesizer 222, which, like frequency synthesizer 22 described above in connection with FIG. 1, also supplies tracking signals to the three RF amplifiers and performs band switching as required. Microprocessor 224, preferably a Motorola MC68705R3 microprocessor, supplies data serially to synthesizer 222 via the DATA line along with a clock signal on the CLOCK line, and corresponding local oscillator and control signals are supplied on lines 223 from frequency synthesizer 222 to RF amplifier and circuitry 202.

IF amplifier-detector 214 includes as a primary circuit element a Motorola MC3359 integrated FM IF amplifier and detector. The first IF stage in IF amplifier-detector 214 preferably includes a dual-crystal filter for enhanced rejection of adjacent channel interference. For proper performance it is important to match the two crystal filters. The output of the FM detector is continually supplied on output line 225 to squelch control pot 244, and is selectively supplied to output line 215 under control of the signal on the MUTE input line, which is connected to internal audio mute control circuitry in IF amplifier-detector 214. The mute control circuitry grounds line 215 to disable the receiver audio output circuit. The audio output circuit may of course be disabled in other ways, such as by switching the power off to audio amplifier 218.

Squelch control pot 244 adjusts the input signal level of a squelch circuit which includes two series-connected high-pass filters 226 and 230 connected to a diode detector 228 which in turn is connected to the input of an internal A/D converter in microprocessor 224. As will be described later in greater detail, microprocessor 224 analyzes the incoming signal from diode detector 228 and, when it is determined that no signal is present on the frequency to which the receiver is currently tuned, outputs a squelch signal on line 231 to transistor switch 232 which activates the internal audio mute control circuitry in IF amplifier-detector 214 for muting the audio.

Figure 6:
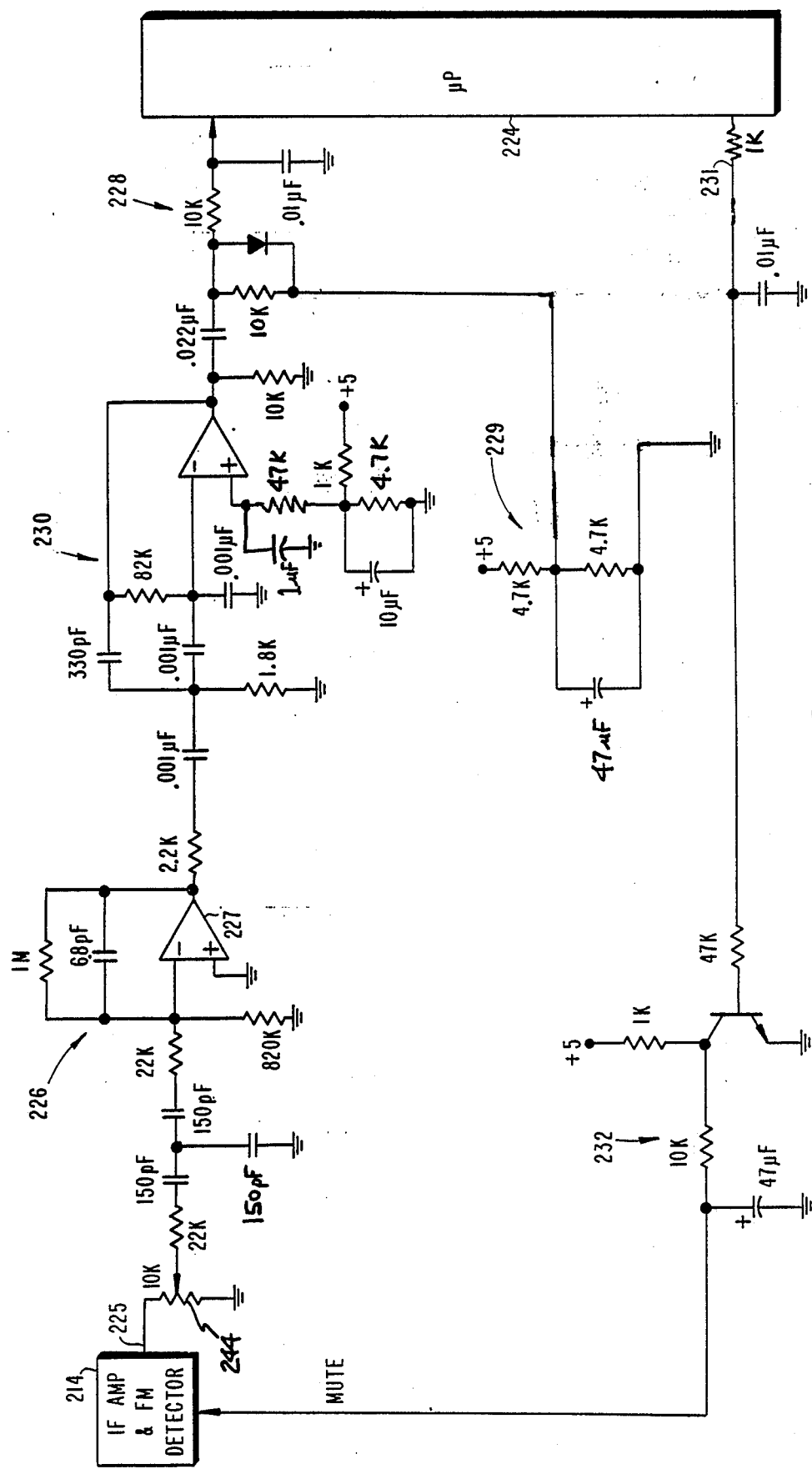
FIG. 6 is a detailed electrical schematic of a portion of the scanning radio receiver shown in FIG. 5.

FIG. 6 shows the detailed construction of filters 226 and 230 and detector 228. Except for the 150 pF capacitor, high-pass filter 226 is the same as filter 26 of FIGS. 1 and 2, and it is similarly constructed around an internal op amp 227 provided in the MC3359 IC. Diode detector 228 includes a simple RC output filter with a very small time constant, preferably 0.1 milliseconds, for greater speed in the squelch circuit and, consequently, greater scanning speed. Filter 230 is provided to obtain a sharper overall high-pass response. It is a second-order Chebyshev high-pass filter with gain of 3 and a corner frequency of 12.5 KHz. Hysteresis is provided in software for the squelch circuit, as will be described, and additional hysteresis is provided by bias adjusting circuit 229 connected to diode detector 228, as shown in FIG. 6. This additional hysteresis helps prevent squelch chatter in response to low signal levels near threshold. As shown in FIG. 6, additional bias is provided at the noninverting input of the op amp in filter 230, and an RC delay network is provided in switch 32.

Microprocessor 224 controls frequency scanning according to the program shown in the flowcharts of FIGS. 7A and 7B, which program is stored in internal ROM. Microprocessor 224 is connected to EEPROM 233, preferably a National Semiconductor NMC9306, which is used for storing the current state identification code. The internal ROM in the microprocessor is programmed the same as the ROM in microprocessor 24 of FIG. 1. Service selection and mode control are performed with STATE/WX switch 234, HWY/CITY switch 236, and SCAN/HOLD switch 238, in the same manner as with their counterparts in FIG. 1, and display 240 and display driver 242 are the same as display 40 and display driver 42. The microprocessor periodically checks the status of the switches and multiplexes the display, as housekeeping routines executed on timer interrupt.

Figure 7:
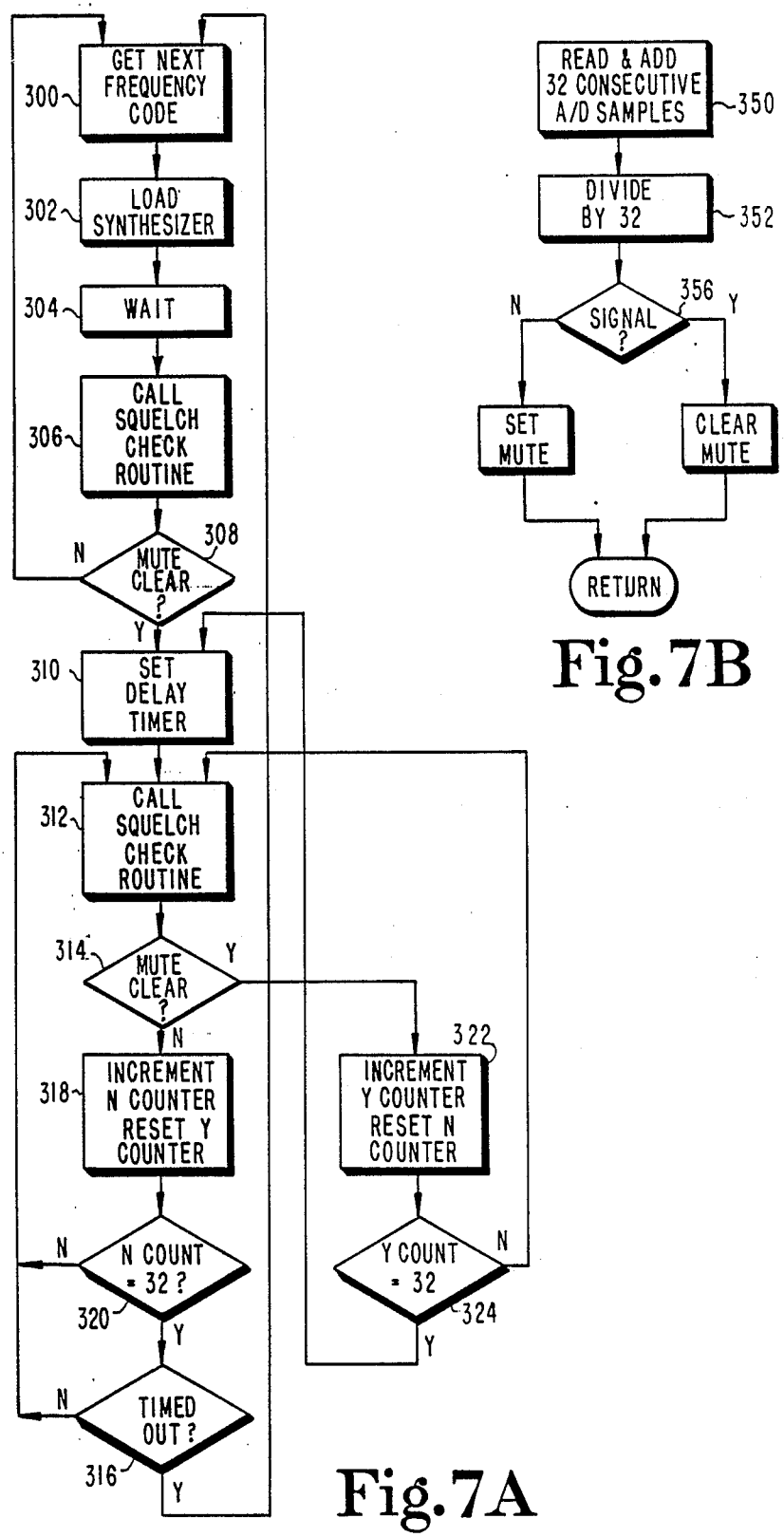
FIG. 7A is a flowchart of the scanning program executed by the microprocessor of FIG. 5.
FIG. 7B is a flowchart of the squelch check routine identified in the flowchart of FIG. 7A.

The squelch circuit will now be described in greater detail with combined reference to FIGS. 5 and 7. Frequency scanning begins when SCAN mode is selected through SCAN/HOLD switch 238. Steps 300-308 are the same as the respective corresponding steps 100-108 described already in connection with FIG. 3. A frequency code is read from memory and loaded into the frequency synthesizer, which is then given time to lock onto the corresponding frequency before the demodulator output is checked. An initial step in the synthesizer loading routing is to set the MUTE line.

In step 350 of the squelch check routine shown in the flowchart of FIG. 7B, microprocessor 224 takes 32 consecutive samples from its internal A/D converter and adds the samples together. Then, in step 352, the accumulated total is divided by 32. The presence or absence of a signal is determined in step 356 on the basis of the resulting average value of the 32 samples, according to a hysteresis curve having upper and lower set points equal to a fixed value ±15 (approximately ±30 millivolts). If a signal is determined to be present, the microprocessor clears the MUTE line, and conversely, if no signal is present, the microprocessor sets the MUTE line. In either event, program control returns to the main program.

The state of the MUTE line, that is, its commanded state established in the squelch check subroutine, is also used by the main program to determine whether or not a signal is present. The microprocessor branches from step 308 back to step 300 if the MUTE line is set when tested in step 308, indicating that a signal is not present on the currently received channel, and proceeds to step 310 if the MUTE line is clear (signal present). As indicated earlier, the receiver audio is muted if no signal is present, whereas the audio output circuit is enabled to audibly reproduce an audio signal if one is found on the current channel. Audio muting and unmuting is delayed from the change of state on line 231, due to the delay in switch 232.

As with the embodiment of FIG. 1, a delay timer is employed to prevent immediate resumption of scanning in response to temporary absence of a signal. The delay time period for the embodiment of FIG. 5 is approximately 600 milliseconds. Delay timer operation is modified in this embodiment, as will be described, to further reduce the effects of random noise and low signal levels near threshold. As with the previous embodiment, if squelch is released after initially locking onto a new channel, the microprocessor executes a delay timer routine. With reference to FIG. 7, program control in such a case proceeds from step 308 to step 310, in which the delay timer is set, and therefrom to step 312 for the first execution of the squelch check subroutine during the delay time period. The next step in the program is conditional branch step 314, in which the MUTE line state is tested. If MUTE is clear, indicating that there is a signal present, a Y counter is incremented and an N counter is reset in step 322. In step 324, program control branches conditionally either to step 310 or step 312, depending on the Y count. If MUTE is not clear when tested in step 314, that is, it remains set from the previous execution of the squelch check subroutine, the N counter is incremented and the Y counter is reset in step 318, after which conditional branch step 320 is executed to cause program control to branch either to step 312 or to step 316 depending on the N count. Step 316 is the same as step 116 of FIG. 3. The program as just described requires validation of signal-present and signal-absent indications prior to, respectively, resetting of the delay timer and resumption of scanning. The determination of signal presence or absence is not considered to be valid until 32 consecutive identical indications thereof are produced in the squelch check subroutine. That is, that subroutine must check the average of 32 consecutive A/D samples 32 times and produce the same result. Thus, if a count in the Y counter reaches 32, the result is interpreted as a valid indication of signal presence and the delay timer is reset. However, a single "no" indication from step 314 causes the Y counter to be reset. Similarly, if the count in the N counter reaches 32, the result is interpreted as a valid indication of signal absence, which is a prerequisite for execution of conditional branch step 316. A single "yes" indication from step 314 will, however, cause the N counter to be reset. Thus, the receiver does not resume scanning until the N count equals 32 when or after the delay timer times out. A single "yes" indication from step 314 cannot cause a reset of the delay timer, but can effectively extend the delay period by causing a reset of the N counter. With the switching threshold of the squelch input of the 3359, the RC network in switch 232 provides a delay of approximately 120 milliseconds prior to unmuting the receiver audio. If desired, this hardware delay could alternatively be provided in software as are the scan resumption delay and the validation scheme just described. That validation scheme and the extra delay provided in switch 232 have been found useful for reducing popping effects and the like in the embodiment being described, but such techniques may not be necessary depending on the particular receiver design and the subjective tolerance of such effects by listeners.

Figure 8:
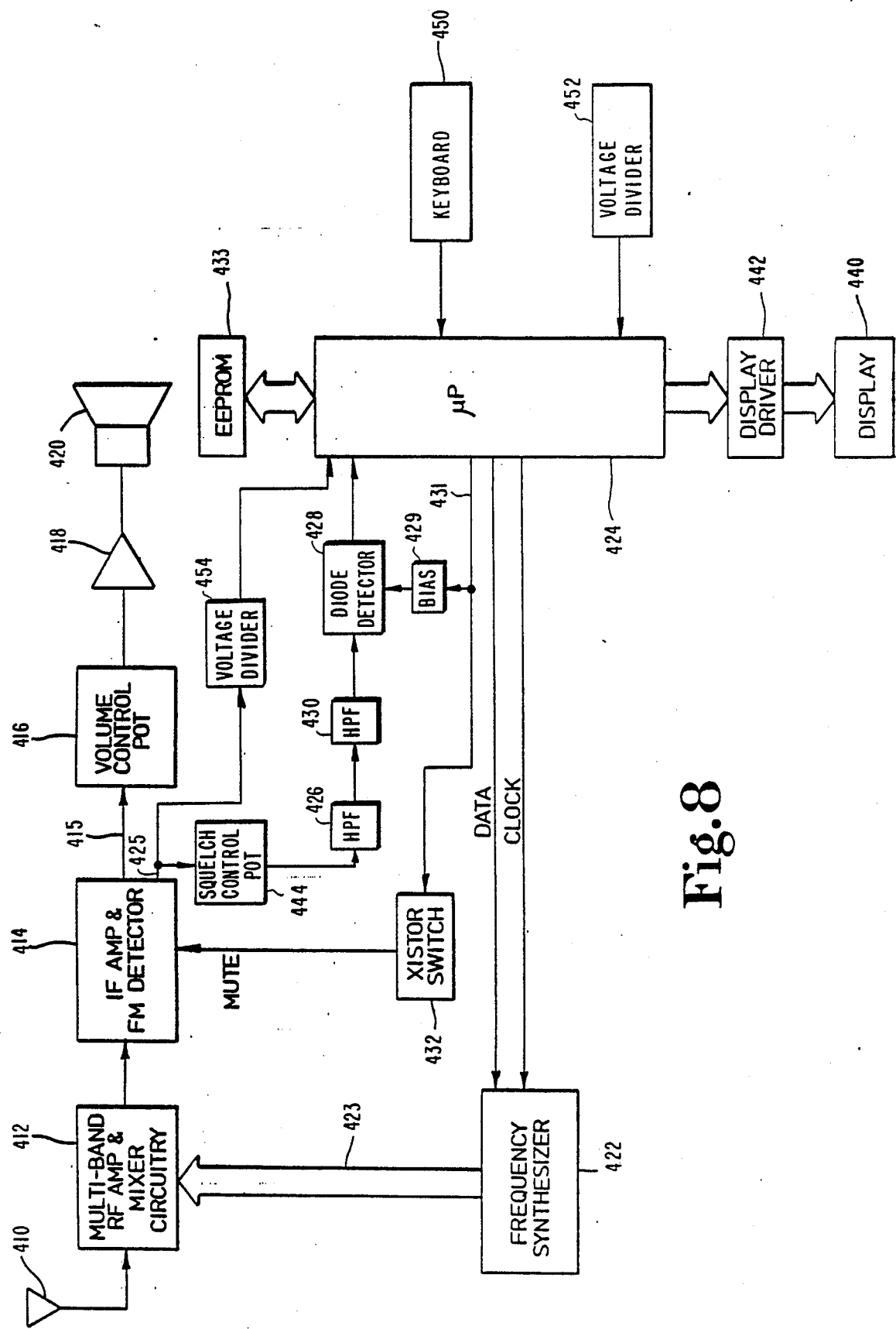
FIG. 8 is a block diagram of another embodiment of the scanning radio receiver according to the present invention.

With reference to FIG. 8, another alternative embodiment of a scanning radio receiver according to the present invention operates in either a SCAN mode, tuning sequentially to user-selected channels, or in a SEARCH mode, tuning sequentially in fixed frequency steps. The receiver includes a priority channel tuning feature operable in SCAN mode, as will be described. The receiver includes an antenna 410 coupled to a conventional superheterodyne FM receiver which includes RF amplifier and mixer circuitry 412, an IF amplifier and FM detector 414, a volume control pot 416, an audio amplifier 418 and a speaker 420. RF amplifier and mixer circuitry 412 includes individual RF amplifiers and mixers for the low and high VHF bands, as well as UHF, aircraft, cellular radiotelephone and 800 MHz bands, and further includes appropriate tracking circuits. The local oscillator signal for the receiver is generated by frequency synthesizer 422, which also supplies tracking signals to the three RF amplifiers and performs band switching as required. Frequency synthesizer 422 is preferably like frequency synthesizer 22 of FIG. 1, except that it employs separate VCOs instead of a single VCO with switched coils. Microprocessor 424, preferably a Motorola MC68705R3 microprocessor, supplies data serially to synthesizer 422 via the DATA line along with a clock signal on the CLOCK line, and corresponding local oscillator and control signals are supplied on lines 423 from frequency synthesizer 422 to RF amplifier and circuitry 412.

IF amplifier-detector 414 includes as a primary circuit element a Motorola MC3359 integrated FM IF amplifier and detector. The first IF stage in IF amplifier-detector 414 preferably includes a dual-crystal filter for enhanced rejection of adjacent channel interference. For proper performance it is important to match the two crystal filters. The output of the FM detector is continually supplied on output line 425 to squelch control pot 444 and a voltage divider 454 and is selectively supplied to output line 415 under control of the signal on the MUTE input line, which is connected to internal audio mute control circuitry in IF amplifier-detector 414. The mute control circuitry grounds line 415 to disable the receiver audio output circuit. The audio output circuit may of course be disabled in other ways, such as by switching the power off to audio amplifier 418.

Squelch control pot 444 adjusts the input signal level of a squelch circuit which includes two series-connected high pass filters 426 and 430 connected to a diode detector 428 which in turn is connected to the input of an internal A/D converter in microprocessor 424. As in the embodiment of FIG. 5, the microprocessor analyzes the incoming signal from the diode detector and, when it is determined that no signal is present on the frequency to which the receiver is currently tuned, outputs a squelch signal, in this case on line 431 to transistor switch 432 which activates the internal audio mute control circuitry in IF amplifier detector 414 for muting the audio. Voltage divider 454 provides a second input to the above mentioned internal A/D converter in microprocessor 424. The A/D converter is selectively coupled to a desired input port through a multiplexer in the microprocessor. A third multiplexed input to the A/D converter is from voltage divider 452, which establishes a fixed value for use in the squelch check subroutine to be described. Voltage divider 452 is a simple resistive divider connected between +5 volts and ground for establishing a fixed reference level.

Figure 9:
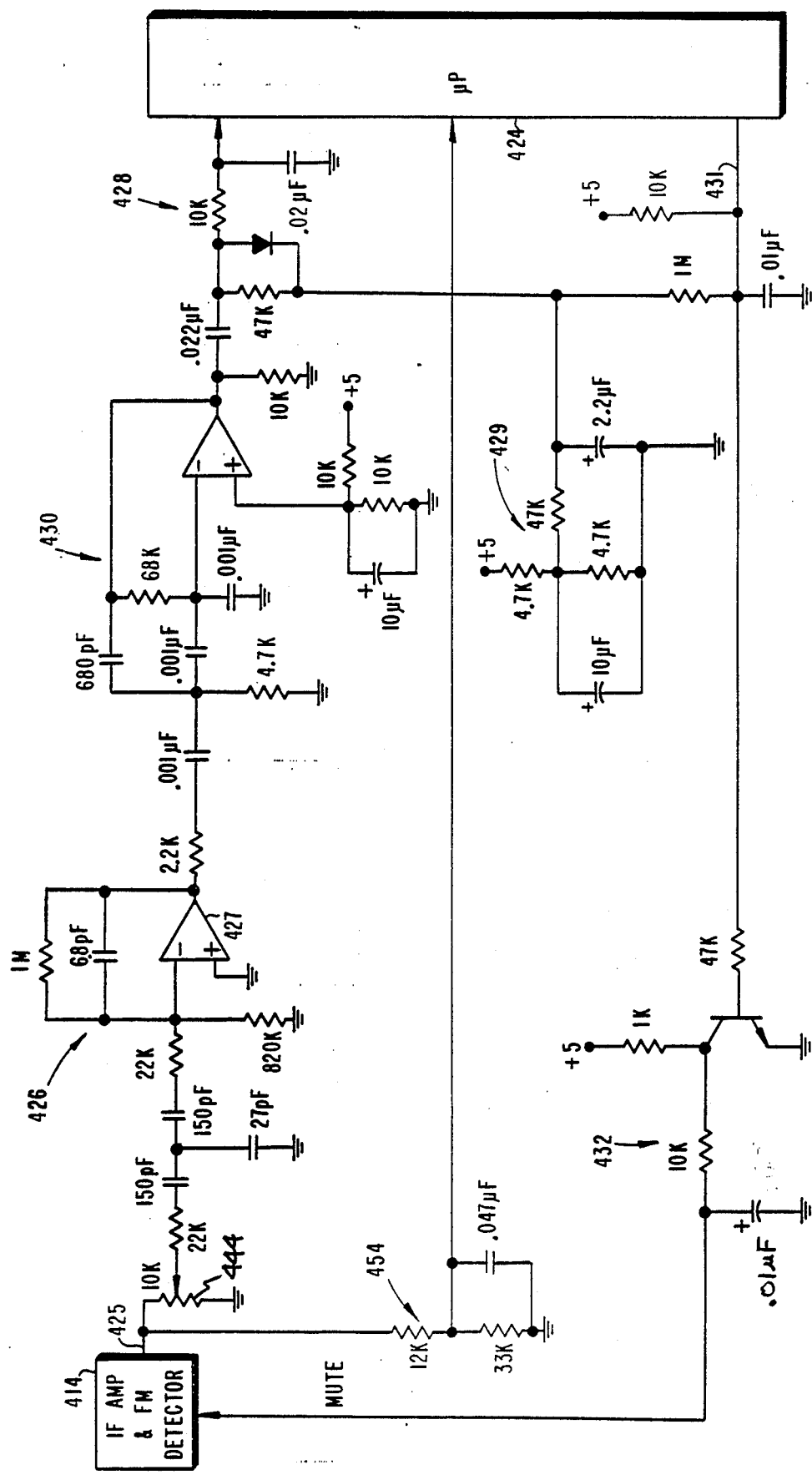
FIG. 9 is a detailed electrical schematic of a portion of the scanning radio receiver shown in FIG. 8.

FIG. 9 shows the detailed construction of filters 426 and 430 and detector 428. High-pass filter 426 has the same frequency response as filter 26 of FIGS. 1 and 2, but unlike that filter it is constructed using an external op amp 427, National Semiconductor type LM358. An external op amp is used in this embodiment to reduce circuit layout sensitivity, although, depending on particular design requirements and the availability of alternative layouts, the internal op amp may be adequate. Diode detector 428 includes a simple RC output filter with a very small time constant, in this case preferably 0.2 milliseconds, for greater speed in the squelch circuit and, consequently, greater scanning speed. Filter 430 is provided to obtain a sharper overall high-pass response. It is a second-order Chebyshev high-pass filter with gain of 1.5 and a corner frequency of 9.5 KHz. Hysteresis is provided in software for the squelch circuit, as will be described, and additional hysteresis is provided by bias adjusting circuit 429 connected to diode detector 428, as shown in FIG. 9. This additional hysteresis helps prevent squelch chatter in response to low signal levels near threshold. Also shown in FIG. 9 is an additional bias circuit at the noninverting input of the op amp in filter 430, and an RC delay network in switch 432.

Microprocessor 424 controls frequency scanning according to the program shown in the flowcharts of FIGS. 10A-10C and 11A-11C, which program is stored in internal ROM. Microprocessor 424 is connected to an EEPROM 433, preferably a National Semiconductor NMC9306, which is used for storing codes for user-selected frequencies. One or more such EEPROMs may be used depending on the number of channels desired for programming. The internal ROM also contains frequency codes for the weather (WX) channels allocated by the FCC, and also contains the frequency steps for SEARCH mode operation in the various bands in which the receiver may be operated. A keyboard 450 is provided for service selection and mode control, and the receiver also includes an alphanumeric display 440, driven by a display driver 442, for display of channel identification and other data.

The squelch circuit will now be described in greater detail with combined reference to FIGS. 8, 10 and 11. FIGS. 10 and 11 are the flowcharts for the programs executed during SCAN mode and SEARCH mode, respectively. In conjunction with the programs to be described, microprocessor 424 executes certain housekeeping routines on timer interrupts. More specifically, at predetermined intervals the microprocessor checks the status of the various keys in the keyboard and multiplexes the display. SCAN mode operation will be described first. Steps 500-508 are the same as the respective corresponding steps 100-108 described already in connection with FIG. 3. A frequency code is read from memory and loaded into the frequency synthesizer, which is then given time to lock onto the corresponding frequency before the demodulator output is checked. An initial step in the synthesizer loading routing is to set the MUTE line.

Figure 10A:
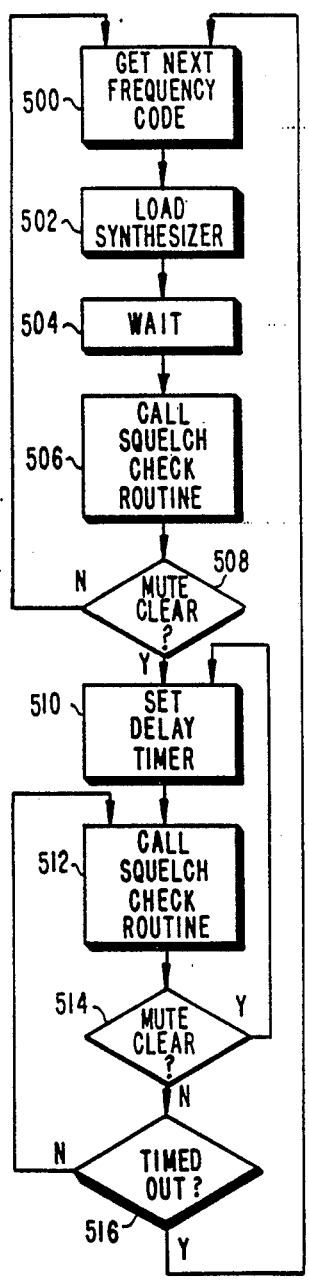
FIGS. 10A–10C are flowcharts associated with the scanning program executed during SCAN mode by the microprocessor of FIG. 8.
Figure 10B:
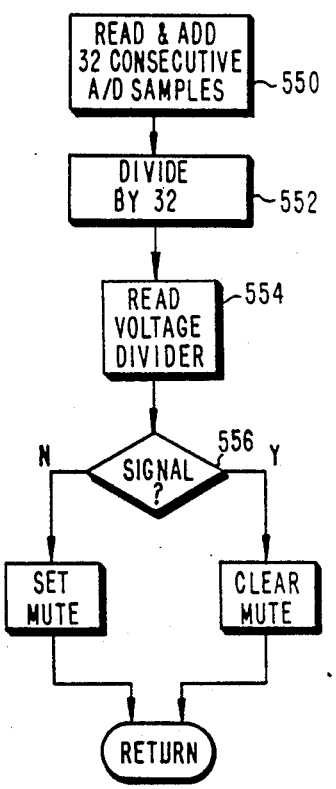

In step 550 of the squelch check routine shown in the flowchart of FIG. 10B, microprocessor 424 takes 32 consecutive samples from its internal A/D converter and adds the samples together, and then, in step 552, the microprocessor divides the accumulated total by 32. The voltage level set by voltage divider 452 is sampled in step 554 and compared, in step 556, with the value determined in step 552. The presence or absence of a signal is determined according to a hysteresis curve having upper and lower set points equal to the voltage divider value ±15 (approximately ±30 millivolts). As in the previously described embodiments, if a signal is determined to be present, the microprocessor clears the MUTE line, and conversely, if no signal is present, the microprocessor sets the MUTE line. In either event, program control returns to the main program.

The state of the MUTE line is also used by the main program to determine whether or not a signal is present. The microprocessor branches from step 508 back to step 500 if MUTE is set, indicating that a signal is not present on the currently received channel, and proceeds to step 510 if MUTE is clear (signal present). As indicated earlier, the receiver audio is muted if no signal is present, whereas the audio output circuit is enabled to audibly reproduce an audio signal if one is found on the current channel.

If the squelch is released, a delay timer (approximately 600 milliseconds) is set in step 510, and the squelch is checked again, in step 512. This time, if there is a signal on the current channel, the microprocessor branches from step 514 back to step 510 to reset the delay timer. If no signal is currently detected, program control proceeds to decision step 516 wherein the delay timer is checked to see if it has timed out. If the timer has timed out, program control returns to step 500 for resumption of frequency scanning. If not, the squelch check routine is again executed in step 512 to recheck for a signal on the current channel.

Figure 10C:
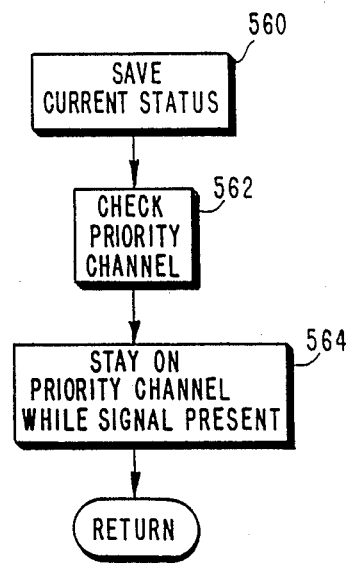
Figure 11A:
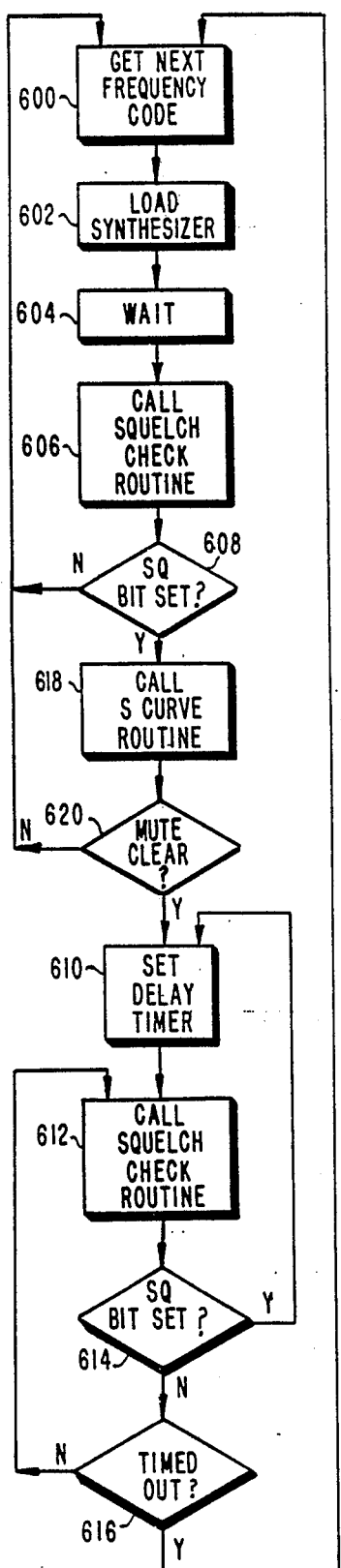
FIGS. 11A–11C are flowcharts of the scanning program executed during SEARCH mode by the microprocessor of FIG. 8.
Figure 11B:
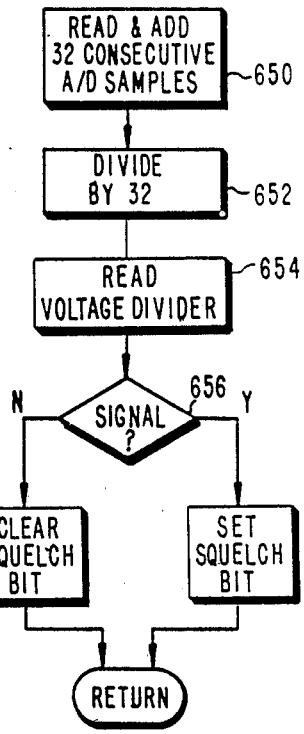
Figure 11C:
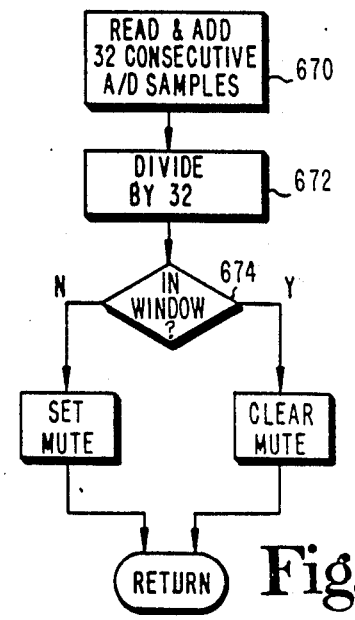

In SCAN mode, with priority mode also selected, the subroutine of FIG. 10C is executed periodically, on timer interrupt. The first step in the subroutine, step 560, is to save current status information. Such information includes the currently selected channel and, if the delay timer has been set for that channel, the current count in the timer. The current status information is used after return to the main program to reestablish the conditions existing prior to execution of the priority channel check subroutine. In step 562, a priority channel is checked in the same manner as discussed above in connection with program steps 500-506 of FIG. 10A. The frequency code for the priority channel to be checked is loaded into the synthesizer, and, after the synthesizer locks on to the channel, the squelch check subroutine is executed to determine whether a signal is present on the priority channel. If a signal is present, the receiver stays on the priority channel as long as the signal remains, as indicated in block 564 of the flowchart. If the first squelch check indicates no signal, the microprocessor immediately returns to the main program. On the other hand, if the first squelch check indicates the presence of a signal on the priority channel, the receiver remains tuned to that priority channel until the signal is absent long enough for the delay timer to time out. The high-speed squelch circuit construction significantly reduces the audio interruption which occurs when a priority channel is checked and thereby significantly enhances the priority channel feature.

SEARCH mode operation will be described with reference to the flowchart of FIG. 11, in which the first step, step 600, is to get the next frequency code. This step involves determining the code for the next frequency in a series of frequencies separated by a fixed frequency increment, which is either 5, 10 or 12.5 KHz in the disclosed embodiment. The receiver is capable of searching up or down, and so step 600 may involve incrementing or decrementing the previous frequency code. Steps 602-606 are the same as steps 502-506, respectively, in FIG. 10A. Similarly, steps 650-654 are the same as steps 550-554, respectively, in FIG. 10B. However, in SEARCH mode, the MUTE line is not directly affected by the result of comparison step 656. Instead, a squelch bit in RAM is either set or cleared depending on whether there is or is not a signal, respectively. The MUTE line is unaffected by the squelch check subroutine in SEARCH mode because in that mode the receiver audio is left muted until the receiver is accurately tuned to an active channel.

The tuning accuracy is checked in an S curve routine which is executed after step 608 if the squelch bit is set. If the squelch bit is not set, indicating no signal on the current channel, the microprocessor branches back to step 600 for tuning to the next frequency. In step 670, the microprocessor reads and adds 32 consecutive A/D samples of the output signal from voltage divider 454, and in step 672 the accumulated total is divided by 32 to obtain the average. The 32 samples are obtained at a rate of one sample approximately every 65 microseconds. Then, in step 674, the average determine in step 672 is checked against the upper and lower limits of a window provided in memory. The FM demodulator produces an output with a range from 0 to 7 volts, and voltage divider 454 scales the output down to a 5-volt range, which is suitable as an input to the microprocessor ($V_{cc}=5$ volts). The window detector has upper and lower limits of 0.7 $V_{cc}$ and 0.35 $V_{cc}$, respectively. If the average value determined is step 672 is within this window, the current channel is considered to be accurately tuned, and accordingly the microprocessor clears the MUTE line. In response, the receiver audio circuitry is unmuted. For values outside the detector window, the MUTE line is set, and in either case program control returns to step 620 in the main program.

If the MUTE line is clear when tested in step 620, indicating that a signal is present and the channel is accurately tuned, the delay timer is set in step 610 to initiate a delay time period. The loop consisting of steps 610–616 is the same as the loop consisting of steps 510–516 in FIG. 10A, with the exception that decision step 614 involves a check of the squelch bit as opposed to a check of the MUTE line. This is because, as indicated above, the squelch check routine does not affect the MUTE line in SEARCH mode, but instead sets or clears a squelch bit depending on the presence or absence of a signal on the current channel. The microprocessor operates in this loop until the transmission on the current channel ceases long enough for the delay timer to time out, after which program control branches back to step 600 to begin searching for another active channel.

We claim:

1. A high-speed scanning radio receiver, comprising:
a radio receiver having an RF amplifier, a mixer, a frequency synthesizer for generation of a local oscillator signal, an IF amplifer, a demodulator, and an audio output stage;
memory means for storing a plurality of frequency codes corresponding to respective radio channels;
scan control means for sequentially reading frequency codes from said memory means and for loading said frequency synthesizer with said sequentially read frequency codes;
squelch circuit means for disabling said audio output stage in the absence of a detected signal on any one of the channels corresponding to said sequentially read frequency codes, said squelch circuit means including a first filter connected to an output of said demodulator, a noise detector connected to an output of said first filter, said noise detector including a first low pass filter with a time constant less than approximately 0.5 milliseconds, A/D converter means connected to said noise detector for converting at least ten samples of an analog signal to digital values in less than approximately 2 milliseconds, means for determining an average value for said at least ten samples, and means for generating a mute signal when said average value is below a predetermined squelch level; and
means for enabling said scan control means in response to said mute signal.

2. The scanning radio receiver of claim 1 wherein said squelch circuit means further includes a second low-pass filter connected between said noise detector and said A/D converter means.

3. The scanning radio receiver of claim 2 wherein said first filter is a multiple-order high-pass filter with a corner frequency of approximately 1.5 KHz, said first low-pass filter has a time constant of approximately 0.1 milliseconds, said second low-pass filter is a multiple-order filter with a corner frequency of approximately 1 KHz, said A/D converter means converts at least 32 analog signal samples to digital values in less than 1 millisecond, and wherein said generating means includes means for averaging at least 32 converted samples.

4. The scanning radio receiver of claim 3 further comprising variable means for setting said squelch level; wherein said means for generating a mute signal includes digital comparator means for comparing the average value of the converted samples with said squelch level according to a hysteresis curve having setpoints which vary in response to the setting of said squelch level.

5. The scanning radio receiver of claim 4 wherein said squelch circuit means includes means for grounding the input of said audio output stage in response to said mute signal.

6. The scanning radio receiver of claim 2 wherein said first filter is a multiple-order high-pass filter with a corner frequency of approximately 1.5 KHz, said first low-pass filter has a time constant of approximately 0.1 milliseconds, said second low-pass filter is a multiple-order filter with a corner frequency of approximately 1 KHz, said A/D converter means converts at least 32 analog signal samples to digital values in less than 1 millisecond, and wherein said generating means includes means for averaging at least 32 converted samples.

7. The scanning radio receiver of claim 1 further comprising variable means for setting said squelch level; wherein said means for generating a mute signal includes digital comparator means for comparing the average value of the converted samples with said squelch level according to a hysteresis curve having setpoints which vary in response to the setting of said squelch level.

8. The scanning radio receiver of claim 1 wherein said squelch circuit means includes means for grounding the input of said audio output stage in response to said mute signal.

9. A high-speed scanning radio receiver, comprising:
a radio receiver having an RF amplifier, a mixer, a frequency synthesizer for generation of a local oscillator signal, an IF amplifier, a demodulator, an audio mute circuit and an audio output stage;
memory means for storing a plurality of frequency codes corresponding to respective radio channels;
search control means for repeatedly loading said frequency synthesizer with a code corresponding to a frequency a fixed frequency increment away from the last frequency code loaded into said synthesizer, said search control means also enabling said audio mute circuit while repeatedly loading said synthesizer;
squelch circuit means for disabling said audio mute circuit when detecting a received signal; and
center tuning means responsive to the detection of a received signal for determining signal where the RF broadcast band interstation frequency spacing is greater than said fixed frequency increment, said center tuning means including A/D means for converting an output signal from said demodulator into a digital data value, digital analysis means for analyzing said digital data value, and means for disabling said search control means in response to said center tuning means detection of said digital data value within a predetermined data range.

10. The scanning radio receiver of claim 9 wherein said digital analysis means includes A/D means for obtaining several digital data samples of the demodulator output signal, averaging means for summing the data samples obtained and dividing said sum by the quantity of data samples to produce an average value for comparison with said predetermined data range.

11. A high-speed scanning radio receiver, comprising:
a radio receiver having an RF amplifier, a mixer, a frequency synthesizer for generation of a local oscillator signal, an IF amplifier, a demodulator, and an audio output stage;

memory means for storing a plurality of frequency codes corresponding to respective radio channels;

scan control means for sequentially reading frequency codes from said memory means and for loading said frequency synthesizer with said sequentially read frequency codes;

search control means for loading said frequency synthesizer with a code corresponding to a frequency a fixed frequency increment away from the last frequency code loaded into said synthesizer;

center tuning means for detecting an optimal tuning frequency for reception of a detected signal where the broadcast band interstation frequency spacing is greater than said fixed frequency increment, said center tuning means including first A/D converter means for converting said demodulator output into digital data, first digital analysis means for analyzing said digital data, and means for disabling said search control means when said first digital analysis means detects said digital data value within a predetermined data range;

squelch circuit means for disabling said audio output stage in the absence of a detected signal on any one of the channels corresponding to said sequentially read frequency codes or frequencies determined to be optimally tuned by said center tuning means, said squelch circuit means including a first filter connected to an output of said demodulator, a noise detector connected to an output of said first filter, said noise detector including a first low pass filter with a time constant less than approximately 0.5 milliseconds, second A/D converter means connected to said noise detector for converting at least ten samples of an analog signal to digital values in less than approximately 2 milliseconds, means for determining an average value for said at least ten samples, and means for generating a mute signal and setting a squelch bit in said memory means when said average value is below a predetermined squelch level;

means for enabling said scan control means in response to said mute signal; and means for enabling said search control means in response to the expiration of a predetermined time delay, said time delay reinitiated each time said high speed squelch means determines that a detected signal is received.

12. The scanning radio receiver of claim 11 wherein said first digital analysis means includes means for obtaining several A/D digital data samples of said demodulator output signal, second averaging means for summing the data samples obtained and dividing said sum by the quantity of data samples obtained to produce a second average value for comparison with data values representative of said predetermined data range.

* * * * *